(12) United States Patent
O'Loughlin et al.

(10) Patent No.: US 6,713,873 B1
(45) Date of Patent: Mar. 30, 2004

(54) ADHESION BETWEEN DIELECTRIC MATERIALS

(75) Inventors: Jennifer O'Loughlin, Portland, OR (US); Andrew W. Ott, Hillsboro, OR (US); Bruce J. Tufts, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/306,642

(22) Filed: Nov. 27, 2002

(51) Int. Cl.[7] .............................................. H01L 23/48
(52) U.S. Cl. ...................... 257/758; 257/753; 257/759; 257/760
(58) Field of Search ................................ 257/753, 758, 257/760, 759

(56) References Cited

U.S. PATENT DOCUMENTS

| | | | | |
|---|---|---|---|---|
| 5,442,237 A | * | 8/1995 | Hughes et al. | 257/759 |
| 5,552,627 A | * | 9/1996 | McCollum et al. | 257/530 |
| 6,111,301 A | * | 8/2000 | Stamper | 257/529 |
| 6,249,055 B1 | * | 6/2001 | Dubin | 257/758 |
| 6,323,554 B1 | * | 11/2001 | Joshi et al. | 257/758 |

* cited by examiner

Primary Examiner—Cathy Lam
(74) Attorney, Agent, or Firm—George Chen

(57) ABSTRACT

The present invention discloses a method including: determining whether a surface of a dielectric layer is reactive; activating the surface if the surface is not reactive; performing a cycle on the surface, the cycle including: reacting the surface with a metal; and activating the metal. The present invention also discloses a structure including: a substrate; a first interlayer dielectric located over the substrate; a first adhesion promoter layer located over the first interlayer dielectric; an etch stop layer located over the first adhesion promoter layer; a second adhesion promoter layer located over the etch stop layer; and a second interlayer dielectric located over the second adhesion promoter layer.

3 Claims, 4 Drawing Sheets

ADHESION BETWEEN DIELECTRIC MATERIALS

BACKGROUND OF THE INVENTION

1. Field of the Invention

The present invention relates to the field of semiconductor integrated circuit (IC) manufacturing, and, more specifically, to a method of improving adhesion at an interface between dielectric materials, as well as, a structure including an adhesion promoter layer at the interface between dielectric materials.

2. Discussion of Related Art

Gordon Moore first suggested in 1965 that the pace of technology innovation would double the number of transistors per unit area on a chip every 18 months. Over the ensuing decades, the semiconductor industry has adhered closely to Moore's Law in improving device density.

Maintaining such an aggressive schedule for each device generation has required continual enhancements at the corresponding technology node. Additive processes using ion implantation, annealing, oxidation, and deposition had to be enhanced to deliver the requisite doping profiles and film stacks. Subtractive processes using photolithography and etch also had to be improved to shrink the features on the chip while maintaining pattern fidelity.

Improving resolution in photolithography to produce a smaller critical dimension (CD) for the features usually decreased the depth of focus (DOF) that was available. However, the smaller DOF could be tolerated if variations in topography were minimized across the chip. Thus, chemical-mechanical polish (CMP) became an enabling technology for both the front-end and the back-end of semiconductor processing.

The scaling down of transistors and wiring to comply with Moore's Law may degrade the performance and reliability of the chip if it is not accomplished properly. For example, the switching speed of the transistors may be adversely impacted if the resistance-capacitance (RC) product delay in the wiring is too large. Resistance may be reduced by using a conductive material with a low resistivity while capacitance may be reduced by using a dielectric material with a low dielectric constant (k). However, adhesion at an interface between two dielectric materials may be inadequate, resulting in poor yield at assembly and packaging from cracking and delamination.

Thus, what is needed is a method of improving adhesion at an interface between dielectric materials, as well as, a structure including an adhesion promoter layer at the interface between dielectric materials.

BRIEF DESCRIPTION OF THE DRAWINGS

FIG. 2G is also an illustration of a cross-sectional view of an embodiment of a structure that includes a very thin adhesion promoter layer, such as a metal oxide, at an interface between an interlayer dielectric (ILD) and an etch stop layer or a hard mask according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention discloses a method of activating a surface of a dielectric material and reacting the surface with a metal to improve adhesion. The present invention also discloses a method of improving adhesion at an interface between dielectric materials. The present invention further discloses a structure that includes a very thin adhesion promoter layer, such as a metal oxide, at an interface between an interlayer dielectric (ILD) and an etch stop layer or a hard mask.

Figure 1:
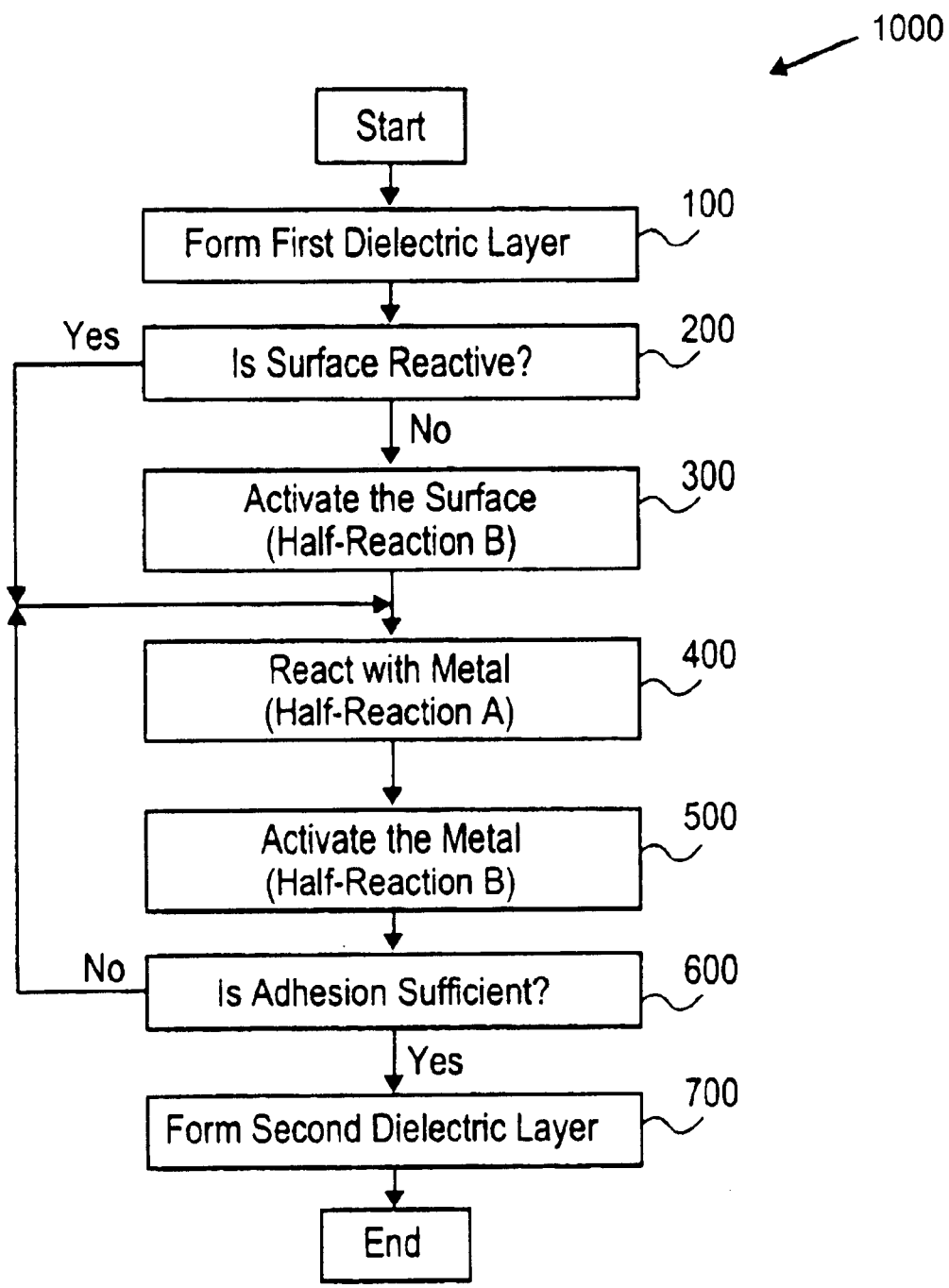
FIG. 1 is a flow chart of a method of activating a surface of a dielectric material and reacting the surface with a metal to improve adhesion according to the present invention.

A method 1000 of activating a surface of a dielectric material and reacting the surface with a metal to improve adhesion will be described first, as shown in an embodiment of the present invention in FIG. 1. A metal-organic chemical vapor deposition (MOCVD) process or an atomic layer deposition (ALD) process may be used. After forming a first dielectric layer, as shown in 100, the method 1000 may involve multiple cycles of a reaction sequence, such as a binary reaction sequence, to form a very thin layer of an adhesion promoter, such as a metal oxide, over a first dielectric layer.

Depending on whether a surface of the first dielectric layer provided is initially reactive enough, as shown in 200, a half-reaction B may be needed, as shown in 300. The half-reaction B, as shown in 300, involves activating the surface, such as by forming a hydroxyl bond with Hydrogen ($H_2$) or water ($H_2O$), to form an activated layer. Then, each cycle would include a half-reaction A, as shown in 400, followed by a half-reaction B, as shown in 500. The half-reaction A, as shown in 400, involves reacting the surface with a metal, such as Titanium, Tantalum, or Aluminum, to form a buffer layer. The half-reaction B, as shown in 500, involves activating the metal, such as by forming a hydroxyl bond with $H_2$ or $H_2O$, to form another activated layer.

In an embodiment of the present invention, one cycle may form about ⅓–½ of a monolayer of the adhesion promoter, such as metal oxide. In another embodiment of the present invention, one cycle may form the adhesion promoter, such as metal oxide, with a thickness of about 1.1–1.3 Angstroms. Depending on whether the adhesion after each cycle is sufficient, as shown in 600, more cycles of the reaction sequence may be repeated to increase the coverage and thickness of the adhesion promoter.

The very thin layer of the adhesion promoter, such as metal oxide, should have appropriate coverage and thickness to result in sufficient adhesion. On the one hand, an excessive thickness of unoxidized metal in the very thin layer of the adhesion promoter may increase leakage current. On the other hand, an excessive thickness of oxidized metal in the very thin layer of the adhesion promoter may increase dielectric constant and capacitance.

Consequently, multiple cycles, alternating between the half-reaction A, as shown in 400, and the half-reaction B, as shown in 500, may be performed to achieve the appropriate coverage and thickness for the adhesion promoter, such as metal oxide. In an embodiment of the present invention, a total of about 3–15 cycles may be performed. In another embodiment of the present invention, a total of about 5–10 cycles may be performed.

In an embodiment of the present invention, about 20–100% of the first dielectric layer may be covered by the very thin layer of the adhesion promoter. In another embodiment of the present invention, the first dielectric layer may be covered by about one monolayer (saturated) of the very thin layer of the adhesion promoter. In still another embodiment of the present invention, the coverage of the very thin layer of the adhesion promoter over the first dielectric layer may be about $1-5 \times 10^{14}$ atoms/cm$^2$.

In an embodiment of the present invention, the very thin layer of the adhesion promoter may have a thickness of about −3 atoms. In another embodiment of the present invention, the very thin layer of the adhesion promoter may have a thickness of about −9 Angstroms. In still another embodiment of the present invention, the very thin layer of the adhesion promoter may have a thickness of about 1–20 Angstroms.

After the appropriate number of cycles has been performed, a second dielectric material is formed over the very thin layer of the adhesion promoter, as shown in 700.

Figure 2A:
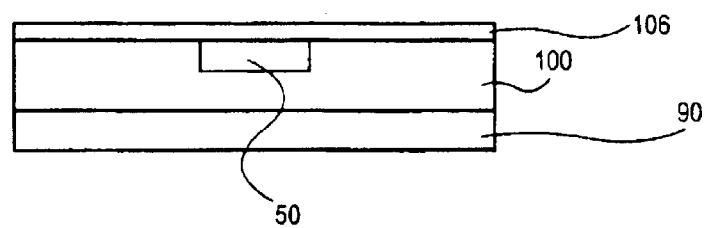
FIGS. 2A–2G are illustrations of a cross-sectional view of an embodiment of a method of improving adhesion at an interface between dielectric materials according to the present invention.

A method of improving adhesion at an interface between dielectric materials will be described next. As shown in an embodiment of the present invention in FIG. 2A, a layer may include a conductor 50 which is embedded or inlaid in the ILD 100 that is located over a wafer 90. The layer may be part of a stack of layers which forms an interconnect system to route signals, power, and ground to and from a device, such as a transistor, formed in the wafer 90.

The wafer 90 may include regions of a semiconductor material, such as Silicon, or an amorphous material, such as polysilicon, which may be isolated laterally and vertically with a dielectric material, such as Silicon Oxide or Silicon Nitride. The regions of the wafer 90 may include topography and patterned features. Certain portions of the topography and patterned features may be doped with other materials, such as Boron, Arsenic, Phosphorus, Fluorine, Carbon, Silicon, Oxygen, or Argon.

An equivalent dielectric constant, or $k_{eff}$, may be defined for the stack of the interconnect system. Each layer in the stack may include dielectric material, such as the etch stop layer 200, the ILD 300, and the hard mask 420, as shown in an embodiment of the present invention in FIG. 2C. The $k_{eff}$ for the stack of the interconnect system depends on the k values of all the dielectric materials in the stack, weighted by the size (lateral extent) and the thickness (vertical extent) of each dielectric material. The ILD 100 may have a thickness selected from a range of about 0.1–2.0 microns (um). The ILD 100 may be thicker in a layer that is located higher up in the stack of the interconnect system. Likewise, the conductor 50 may be thicker, wider, and longer in a layer that is located higher up in the stack of the interconnect system.

In general, the $k_{eff}$ value for the stack of the interconnect system should be minimized. Otherwise, excessive intralayer and interlayer capacitance may contribute to cross-talk and increase resistance-capacitance (RC) product delay of the interconnect system. Such an increase in the RC product delay will degrade switching speed of the device in the wafer 90 that is connected to the conductor 50 in the ILD 100.

The $k_{eff}$ value should be further reduced as the minimum permitted spacing between adjacent conductors 50 within the same layer is decreased. Most road maps of semiconductor technology project that the critical dimension (CD) of the minimum feature of a device will shrink by about 30% for each technology node.

Some typical values of $k_{eff}$ will be described next for illustrative purposes. For a device design rule of about 180 nanometers (nm), the $k_{eff}$ value should be about 4.0 or lower. For a device design rule of about 130 nm, the $k_{eff}$ value should be about 3.5 or lower. For a device design rule of about 90 nm, the $k_{eff}$ value should be about 3.0 or lower. For a device design rule of about 65 nm, the $k_{eff}$ value should be about 2.5 or lower. For a device design rule of about 45 nm, the $k_{eff}$ value should be about 2.0 or lower.

The ILD 100 may be formed in various ways. In one embodiment of the present invention, the ILD 100 may be formed by applying, or coating, a spin-on dielectric (SOD). In another embodiment of the present invention, the ILD 100 may be formed by plasma-enhanced chemical vapor deposition (PECVD). Typical conditions for PECVD of the ILD 100 may include a power of about 300–3,500 Watts (W), a pressure of about 100–1,000 Pascals (Pa), a temperature of about 300–425 degrees Centigrade, and a gas flow rate of about 50–1,000 standard cubic feet per minute (scfm).

A material is considered to have a low k value if its k value is lower than the k value of undoped Silicon Oxide ($SiO_2$) which is about 4.0. The k value may be reduced by decreasing the polarizability of the bonds in the $SiO_2$ network. For example, Carbon-Carbon double bonds and Carbon-Carbon triple bonds have higher electronic polarizability because of the increased mobility of the p electrons. On the other hand, Carbon-Carbon single bonds and Carbon-Fluorine single bonds have lower electronic polarizability. Thus, Fluorine may be added to $SiO_2$, to form a Fluorinated Silicate Glass (FSG or SiOF) with a k value of about 3.5. Alternatively, Carbon may be added to $SiO_2$ to form an Organosilicate Glass (OSG) or a Carbon-doped Oxide (CDO or SiOC) with a k value of about 2.0–3.0. However, single bonds also have lower bond strength so thermal stability may be lower.

The k value may be reduced by lowering the density of the $SiO_2$ network. In an embodiment of the present invention, lighter atoms may be substituted into $SiO_2$, such as by replacing some of the Silicon atoms with lighter Carbon atoms to form CDO. Some of the Oxygen atoms may also be replaced with lighter Hydrogen atoms. In one embodiment of the present invention, CDO may include about 5–20 percent by atom of Carbon.

The k value may be reduced by disrupting the structure of the $SiO_2$ network. In an embodiment of the present invention, some non-polar and space-occupying groups, such as methyl, ethyl, and phenyl groups, may be incorporated into the $SiO_2$ film. The CDO may be formed by PECVD with a precursor, such as trimethylsilane, tetramethylsilane, or tetramethylcyclotetrasiloxane. A precursor having more methyl groups may incorporate more Carbon into the film, but such a precursor is also more difficult to dissociate so the deposition rate may be lower.

The k value may be reduced by increasing free volume in the $SiO_2$ network. The free volume may be increased by forming pores. The pores may have a diameter that is selected from a range of about 50–200 Angstroms. Smaller pores may reduce the potential for cracking and delamination under stress, such as during assembly and packaging.

In one embodiment of the present invention, a porous ILD 100 may be formed by coating of a SOD that includes a thermally degradable material, or porogen, within a host thermosetting matrix. Subsequent heating to a temperature below the glass transition temperature, $T_g$, of the host matrix will result in crosslinking of the matrix and phase-separation of the porogen from the matrix, followed by decomposition of the porogen, and diffusion of volatile byproducts out of the matrix to form pores.

In another embodiment of the present invention, the porous ILD 100 may be formed by coating of a SOD that includes a thermally decomposable pendant group covalently attached to a thermosetting polymer backbone having a high $T_g$.

In still another embodiment of the present invention, the porous ILD 100 may be formed by PECVD of a material that includes labile organic groups, followed by chemical or thermal oxidation of the organic side-chains to form pores.

A material is considered to have a pore fraction by volume, or porosity, of zero if it has no pores. In one embodiment of the present invention, the porosity of the ILD 100 may be selected from a range of about 0.02–0.75. A lower porosity will usually result in greater retention of the mechanical strength and the thermal conductivity of the bulk material.

In an embodiment of the present invention, pores may transition from small, closed pores to larger, interconnected pores at a porosity of about 0.20–0.30. Interconnected pores may become open pores at a surface if enough of the bulk material is removed. Open pores are usually less desirable due to higher susceptibility to absorption and diffusion of process chemicals.

The k value of the porous ILD 100 will depend upon both the k value of the bulk material forming the ILD 100 and the k value of the material filling the pores, as weighted by the porosity of the ILD 100. The pores may be filled with air, which has a k value of 1.0, or another gas. In one embodiment of the present invention, the ILD 100, with pores filled with air, may have a k value of about 2.5 or lower.

Figure 2B:
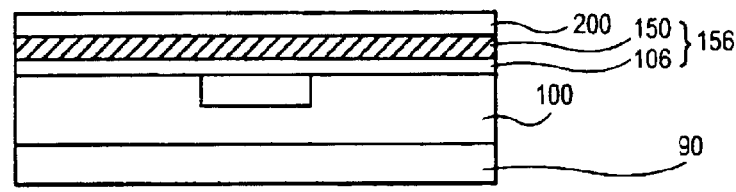

A lower adhesion promoter layer 156 may be formed, as needed, to improve adhesion between the underlying ILD 100 and the etch stop layer 200, as shown in an embodiment of the present invention in FIG. 2B. A self-limiting or self-terminating surface reaction may be used to provide atomic-layer control of the thickness of the lower adhesion promoter layer 156.

In an embodiment of the present invention, the lower adhesion promoter layer 156 may be formed from multiple precursors with a MOCVD process that exposes a substrate, such as the ILD 100, to two or more precursors at a time in the gas phase. The thickness formed depends on the deposition rate and the deposition time.

In another embodiment of the present invention, the lower adhesion promoter layer 156 may be formed from multiple precursors with an ALD process that exposes the substrate, such as the ILD 100, to one precursor at a time in the gas phase, separated by purges. The thickness formed depends on the thickness per exposure and the number of exposures. If the reaction sequence is binary, each exposure to a precursor will involve a half-reaction.

An embodiment of the present invention may involve a binary reaction sequence, in which case ALD exposes the substrate, first, to one precursor, and then, to the other precursor, with a purge in between.

In an embodiment of the present invention, the surface of the substrate is not reactive enough and cannot react directly, such as with a metal compound precursor. As a result, the substrate must first be activated, as needed, by exposure to a pulse of a non-metal compound precursor that is a reactive gas, such as Hydrogen ($H_2$) or water ($H_2O$), to form a lower activated layer 106 with a reaction, such as:

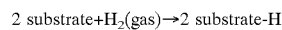

or

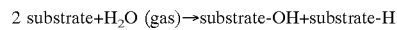

Formation of the lower activated layer 106 may include conversion of an Si—O bond (in $SiO_2$ or CDO) or an Si—C bond (in CDO) at the surface of the ILD 100 to an Si—OH bond or an Si—H bond. During activation of the surface of the ILD 100, oxidation of the conductor 50 or the ILD 100 should be minimized so the $k_{eff}$ value of the stack of the interconnect will not be increased. In an embodiment of the present invention, a plasma or a thermal treatment may be used to assist in the activation of the substrate.

Next, any residual non-metal compound precursor is removed by purging. Purging may involve pumping away a precursor that is reactive. Alternatively, purging may involve pumping in a non-reactive gas to flush and replace the reactive precursor.

Then, the lower activated layer 106 is treated by exposure to a pulse of the metal compound precursor, $MX_n$, to form a lower buffer layer 150 with a reaction, that may be called a half-reaction A, such as:

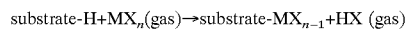

or

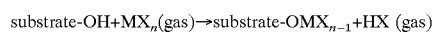

In another embodiment of the present invention, the surface of the substrate is reactive enough and can react directly with the metal compound precursor. Such a substrate does not require activation and may be treated directly by exposure to a pulse of a metal compound precursor, $MX_n$, to form the lower buffer layer 150 with another reaction, that may be called an alternative half-reaction A, such as:

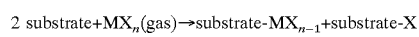

The metal compound precursor, $MX_n$, typically has a stoichiometry where n is 2–4. The M- may include a metal, such as Titanium (Ti), Tantalum (Ta), or Aluminum (Al). In one embodiment of the present invention, the functional group, -X, may include a halogen, such as Chlorine. In another embodiment of the present invention, the functional group, -X, may include an organic ligand or a hydrocarbon moiety, such as a Methyl group.

The metal compound precursor should be a liquid with a high vapor pressure so that the process temperature will not exceed the pyrolysis, or decomposition, temperature of the metal compound precursor. In one embodiment of the present invention, the metal compound precursor is trimethylaluminum, $(Al(CH_3)_3)$. Then, the surface functionality will alternate between a methylated surface and a hydroxylated surface for the two half-reactions of the binary reaction sequence.

The reaction conditions are chosen such that the reaction to form the lower buffer layer 150, called half-reaction A, is completed at the surface of the substrate. The functional group, -X, is attached to the surface of the substrate (to passivate the surface of the substrate) to prevent any further reaction with the metal compound precursor in the gas phase. Typical process parameters for providing a self-limiting or self-terminating reaction may include a pressure of about $10^{-5}$–$10^1$ Torr, a temperature of about 200–550 degrees Centigrade, and a pulse duration of about 0.5–25 seconds.

Next, any residual metal compound precursor is removed by purging.

Then, the functional group, -X, is removed from the surface of the substrate (to reactivate the surface of the substrate) by exposure to a non-metal compound precursor that is a reactive gas, such as Hydrogen ($H_2$) or water ($H_2O$), with a reaction, that may be called a half-reaction B, such as:

substrate-M-$X_{n-1}$+$H_2$(gas)→substrate-M-H+H$X_{n-1}$(gas)

or substrate-M-$X_{n-1}$+$H_2O$ (gas)→substrate-M-OH+H$X_{n-1}$(gas)

In an embodiment of the present invention, a plasma or thermal treatment may be used to assist in removal of the functional group, -X, from the surface of the substrate and reactivation of the surface of the substrate.

In another embodiment of the present invention, the non-metal compound precursor may include Oxygen ($O_2$), Hydrogen Peroxide ($H_2O_2$), or Ammonia ($NH_3$).

Next, any residual non-metal compound precursor may be removed by purging.

The lower adhesion promoter layer 156 should have just enough coverage and thickness to improve adhesion. On the one hand, an excessive thickness of unoxidized metal in the lower adhesion promoter layer 156 may increase leakage current, such as between conductors 50 (such as in FIG. 2B) in the same layer of the stack in the interconnect. On the other hand, an excessive thickness of oxidized metal in the lower adhesion promoter layer 156 may increase the keff value of the stack in the interconnect.

One cycle includes a half-reaction A, with the metal compound precursor, followed by a half-reaction B, with the non-metal compound precursor. In an embodiment of the present invention, one cycle may form about ⅓–½ of a monolayer for the lower buffer layer 150 over the lower activated layer 106. In another embodiment of the present invention, one cycle may form a thickness of about 1.1–1.3 Angstroms for the lower buffer layer 150 over the lower activated layer 106. Consequently, multiple cycles, alternating between the half-reaction A and the half-reaction B, may be performed to achieve the desired coverage and thickness for the lower adhesion promoter layer 156. In an embodiment of the present invention, a total of about 3–15 cycles may be performed. In another embodiment of the present invention, a total of about 5–10 cycles may be performed.

In a first embodiment of the present invention as shown in FIG. 2B, the lower activated layer 106 is covered by the lower buffer layer 150. In a second embodiment of the present invention, about 20–100% of the lower activated layer 106 is covered by the lower buffer layer 150. In a third embodiment of the present invention, the lower activated layer 106 is covered by about one monolayer (saturated) of the lower buffer layer 150. In a fourth embodiment of the present invention, the coverage of the metal oxide in the lower buffer layer 150 over the lower activated layer 106 may be about $1-5 \times 10^{14}$ atoms/cm$^2$.

In one embodiment of the present invention, the lower adhesion promoter layer 156 may have a thickness of about 1–3 atoms. In another embodiment of the present invention, the lower adhesion promoter layer 156 may have a thickness of about 3–9 Angstroms. In still another embodiment of the present invention, the lower adhesion promoter layer 156 may have a thickness of about 4–20 Angstroms.

An etch stop layer 200 is then formed over the lower adhesion promoter layer 156, as shown in an embodiment of the present invention in FIG. 2B. Materials that may be used for the etch stop layer 200 include Silicon Nitride ($Si_3N_4$), which has a k value of about 6.5–9.0, and Silicon Carbide (SiC), which has a k value of about 4.0–6.0. Silicon Oxynitride (SiON), which has a k value intermediate between SiO2 and $Si_3N_4$, or about 5.0–7.0, may also be used for the etch stop layer 200. The k value may be determined by measuring capacitance on a parallel-plate electrical structure.

The k value of the etch stop layer 200 is usually larger than the k value of the underlying ILD 100. As a result, the thickness of the etch stop layer 200 should be minimized so as to reduce the $k_{eff}$ value of the stack in the interconnect system. The etch stop layer 200 may have a thickness selected from a range of about 200–1,500 Angstroms. The etch stop layer 200 may be thicker in a layer that is located higher up in the stack of the interconnect system.

Figure 2C:
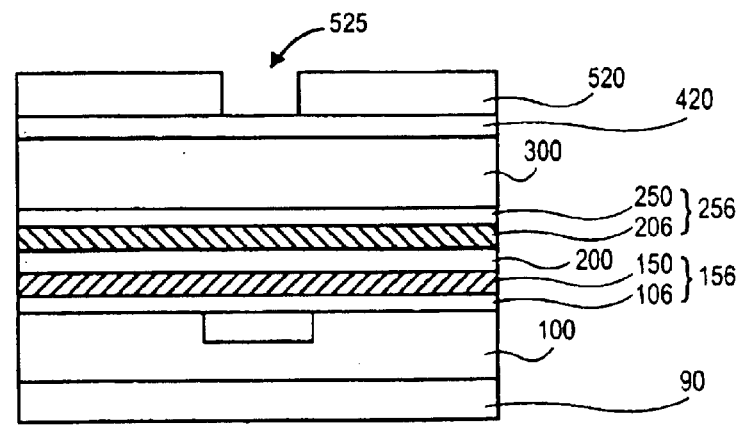

An upper adhesion promoter layer 256 may be formed, as needed, to improve adhesion between the etch stop layer 200 and an overlying ILD 300, as shown in an embodiment of the present invention in FIG. 2C. A self-limiting or self-terminating surface reaction may be used to provide atomic-layer control of the thickness of the upper adhesion promoter layer 256.

In an embodiment of the present invention, the upper adhesion promoter layer 256 may be formed from multiple precursors with a MOCVD process that exposes a substrate, such as the etch stop layer 200, to two or more precursors at a time in the gas phase. The thickness formed depends on the deposition rate and the deposition time.

In another embodiment of the present invention, the upper adhesion promoter layer 256 may be formed from multiple precursors with an ALD process that exposes the substrate, such as the etch stop layer 200, to one precursor at a time in the gas phase, separated by purges. The thickness formed depends on the thickness per exposure and the number of exposures. If the reaction sequence is binary, each exposure to a precursor will involve a half-reaction.

An embodiment of the present invention may involve a binary reaction sequence, in which case ALD exposes the substrate, first, to one precursor, and then, to the other precursor, with a purge in between.

In an embodiment of the present invention, the surface of the substrate is not reactive enough and cannot react directly, such as with a metal compound precursor. As a result, the substrate must first be activated, as needed, by exposure to a pulse of a non-metal compound precursor that is a reactive gas, such as Hydrogen ($H_2$) or water ($H_2O$), to form an upper activated layer 206 with a reaction, such as:

2 substrate+$H_2$(gas)→2 substrate-H or 2 substrate+$H_2O$ (gas)→substrate-OH+substrate-H Formation of the upper activated layer 206 may include conversion of an Si—O bond (in Silicon Oxynitride) or an Si—C bond (in Silicon Carbide) or an Si—N bond (in Silicon Nitride or Silicon Oxynitride) at the surface of the etch stop layer 200 to an Si—OH bond or an Si—H bond. During activation of the surface of the etch stop layer 200, oxidation of the etch stop layer 200 should be minimized so the $k_{eff}$ value of the stack of the interconnect will not be increased. In an embodiment of the present invention, a plasma or a thermal treatment may be used to assist in the activation of the substrate.

Next, any residual non-metal compound precursor is removed by purging. Purging may involve pumping away a precursor that is reactive. Alternatively, purging may involve pumping in a non-reactive gas to flush and replace the reactive precursor.

Then, the upper activated layer 206 is treated by exposure to a pulse of the metal compound precursor, M$X_n$, to form an upper buffer layer 250 with a reaction, that may be called a half-reaction A, such as:

substrate-H+M$X_n$(gas)→substrate-M$X_{n-1}$+HX (gas)

or substrate-OH+M$X_n$(gas)→substrate-OM$X_{n-1}$+HX (gas)

In another embodiment of the present invention, the surface of the substrate is reactive enough and can react directly with the metal compound precursor. Such a substrate does not require activation and may be treated directly by exposure to a pulse of a metal compound precursor, $MX_n$, to form the upper buffer layer 250 with another reaction, that may be called an alternative half-reaction A, such as:

2 substrate+$MX_n$(gas)→substrate-$MX_{n-1}$+substrate-X

The metal compound precursor, $MX_n$, typically has a stoichiometry where n is 2–4. The M- may include a metal, such as Titanium (Ti), Tantalum (Ta), or Aluminum (Al). In one embodiment of the present invention, the functional group, -X, may include a halogen, such as Chlorine. In another embodiment of the present invention, the functional group, -X, may include an organic ligand or a hydrocarbon moiety, such as a Methyl group.

The metal compound precursor should be a liquid with a high vapor pressure so that the process temperature will not exceed the pyrolysis, or decomposition, temperature of the metal compound precursor. In one embodiment of the present invention, the metal compound precursor is trimethylaluminum, $(Al(CH_3)_3)$. Then, the surface functionality will alternate between a methylated surface and a hydroxylated surface for the two half-reactions of the binary reaction sequence.

The reaction conditions are chosen such that the reaction to form the upper buffer layer 250, called half-reaction A, is completed at the surface of the substrate. The functional group, -X, is attached to the surface of the substrate (to passivate the surface of the substrate) to prevent any further reaction with the metal compound precursor in the gas phase. Typical process parameters for providing a self-limiting or self-terminating reaction may include a pressure of about $10^{-5}$–$10^1$ Torr, a temperature of about 200–550 degrees Centigrade, and a pulse duration of about 0.5–25 seconds.

Next, any residual metal compound precursor is removed by purging.

Then, the functional group, -X, is removed from the surface of the substrate (to reactivate the surface of the substrate) by exposure to a non-metal compound precursor that is a reactive gas, such as Hydrogen ($H_2$) or water ($H_2O$), with a reaction, that may be called a half-reaction B, such as:

substrate-M-$X_{n-1}$+$H_2$(gas)→substrate-M-H+$HX_{n-1}$(gas)

or substrate-M-$X_{n-1}$+$H_2O$(gas)→substrate-M-OH+$HX_{n-1}$(gas)

In an embodiment of the present invention, a plasma or thermal treatment may be used to assist in removal of the functional group, -X, from the surface of the substrate and reactivation of the surface of the substrate.

In another embodiment of the present invention, the non-metal compound precursor may include Oxygen ($O_2$), Hydrogen Peroxide ($H_2O_2$), or Ammonia ($NH_3$).

Next, any residual non-metal compound precursor may be removed by purging.

The upper adhesion promoter layer 256 should have just enough coverage and thickness to improve adhesion. On the one hand, an excessive thickness of unoxidized metal in the upper adhesion promoter layer 256 may increase leakage current, such as between inlaid interconnect 750 (such as in FIG. 2G) in the same layer of the stack in the interconnect. On the other hand, an excessive thickness of oxidized metal in the upper adhesion promoter layer 256 may increase the $k_{eff}$ value of the stack in the interconnect.

One cycle includes a half-reaction A, with the metal compound precursor, followed by a half-reaction B, with the non-metal compound precursor. In an embodiment of the present invention, one cycle may form about ⅓–½ of a monolayer for the upper buffer layer 250 over the upper activated layer 206. In another embodiment of the present invention, one cycle may form a thickness of about 1.1–1.3 Angstroms for the upper buffer layer 250 over the upper activated layer 206. Consequently, multiple cycles, alternating between the half-reaction A and the half-reaction B, may be performed to achieve the desired coverage and thickness for the upper adhesion promoter layer 256. In an embodiment of the present invention, a total of about 3–15 cycles may be performed. In another embodiment of the present invention, a total of about 5–10 cycles may be performed.

In a first embodiment of the present invention as shown in FIG. 2C, the upper activated layer 206 is covered by the upper buffer layer 250. In a second embodiment of the present invention, about 20–100% of the upper activated layer 206 is covered by the upper buffer layer 250. In a third embodiment of the present invention, the upper activated layer 206 is covered by about one monolayer (saturated) of the upper buffer layer 250. In a fourth embodiment of the present invention, the coverage of the metal oxide in the upper buffer layer 250 over the upper activated layer 206 may be about $1$–$5 \times 10^{14}$ atoms/$cm^2$.

In one embodiment of the present invention, the upper adhesion promoter layer 256 may have a thickness of about 1–3 atoms. In another embodiment of the present invention, the upper adhesion promoter layer 256 may have a thickness of about 3–9 Angstroms. In still another embodiment of the present invention, the upper adhesion promoter layer 256 may have a thickness of about 4–20 Angstroms.

An overlying ILD 300 is then formed over the upper adhesion layer 256, as shown in an embodiment of the present invention in FIG. 2C. The ILD 300 may have a thickness selected from a range of about 0.1–2.0 um. The ILD 300 may be thicker in a layer that is located higher up in the stack of the interconnect system.

The ILD 300 may be formed in various ways. In one embodiment of the present invention, the ILD 300 may be formed by applying, or coating, a SOD. In another embodiment of the present invention, the ILD 300 may be formed by PECVD. Typical conditions for PECVD of the ILD 300 may include a power of about 300–3,500 W, a pressure of about 100–1,000 Pa, a temperature of about 300–425 degrees Centigrade, and a gas flow rate of about 50–1,000 scfm.

In one embodiment of the present invention, a porous ILD 300 may be formed by coating of a SOD that includes a thermally degradable material, or porogen, within a host thermosetting matrix. Subsequent heating to a temperature below the glass transition temperature, $T_g$, of the host matrix will result in cross-linking of the matrix and phase-separation of the porogen from the matrix, followed by decomposition of the porogen, and diffusion of volatile byproducts out of the matrix to form pores.

In another embodiment of the present invention, a porous ILD 300 may be formed by coating of a SOD that includes a thermally decomposable pendant group covalently attached to a thermosetting polymer backbone having a high $T_g$.

In still another embodiment of the present invention, a porous ILD 300 may be formed by PECVD of a material that includes labile organic groups, followed by chemical or thermal oxidation of the organic side-chains to form pores.

In one embodiment of the present invention, the porosity of the ILD 300 may be selected from a range of about 0.02–0.75. A lower porosity will usually result in greater retention of the mechanical strength and the thermal conductivity of the bulk material.

In an embodiment of the present invention, pores may transition from small, closed pores to larger, interconnected pores at a porosity of about 0.20–0.30. Interconnected pores may become open pores at a surface if enough of the bulk material is removed. Open pores are usually less desirable due to higher susceptibility to absorption and diffusion of process chemicals.

The k value of a porous ILD 300 will depend upon both the k value of the bulk material forming the ILD 300 and the k value of the material filling the pores, as weighted by the porosity of the ILD 300. The pores may be filled with air, which has a k value of 1.0, or another gas. In one embodiment of the present invention, the ILD 300, with pores filled with air, may have a k value of about 2.5 or lower.

An embodiment of a variation of a via-first process flow for a dual Damascene scheme will be described next. However, different embodiments of the present invention are compatible with other process flows, such as a variation of a trench-first process flow for a dual Damascene scheme. Other embodiments of the present invention are compatible with other schemes, such as a single Damascene scheme.

A hard mask 420 is formed over the ILD 300, as shown in an embodiment in FIG. 2C. The hard mask 420 may have a thickness selected from a range of about 200–1,800 Angstroms. Then, the processes of photolithography and etch are used to pattern a via opening 527. First, a radiation-sensitive material, such as a vialayer photoresist 520, may be applied over the hard mask 420. Next, a portion of the via-layer photoresist 520 is exposed to radiation of the appropriate wavelength, energy, and dose. The exposure is performed in an imaging tool, such as a stepper or a scanner. A via-layer reticle may be placed in the path of the radiation to determine the portion of the via-layer photoresist 520 that is to be exposed. Exposure is followed by development of the via-layer photoresist 520 to create a via-layer mask. The via-layer mask includes a via feature 525 that corresponds to the exposed portion of the via-layer photoresist 520, as shown in an embodiment of the present invention in FIG. 2C.

The shape and CD of the via feature 525 in the via-layer photoresist 520 is derived from a design on the via-layer reticle. The via feature 525 that has been patterned in the via-layer photoresist 520 may be transferred into the hard mask 420 by a dry etch process, such as a plasma etch process or a reactive ion etch (RIE) process.

The via-layer photoresist 520 is then stripped off, leaving the hard mask 420 in place. Another dry etch process may be used to etch a via opening 527 through the ILD 300. High directionality is desired for the via opening 527 etch when the narrowest portion of the via opening 527 has a large aspect ratio (depth:width), such as about 7:1 or greater. In one embodiment of the present invention, a high-density plasma, such as a radio frequency (RF) inductively-coupled plasma (ICP), may be used.

The dry etch of the ILD 300 to form the via opening 527 may be performed with a gas mixture. The gas mixture for etching an ILD 300 formed from an inorganic material may include an etching gas, such as $CF_4$, and a polymerizing gas, such as $CH_2F_2$. The etching gas serves as the principal source of Fluorine for etching the ILD 300 while the polymerizing gas improves selectivity by passivating the sidewalls of the via opening 527 during the etch. The etch selectivity of the ILD 300 relative to the hard mask 420 may be about 20:1 or greater. Other gases that may be used for via opening 527 etch include $CHF_3$ and $C_3F_6$. The etch rate of the ILD 300 may be selected from a range of about 1,500–12,000 Angstroms per minute.

Figure 2D:
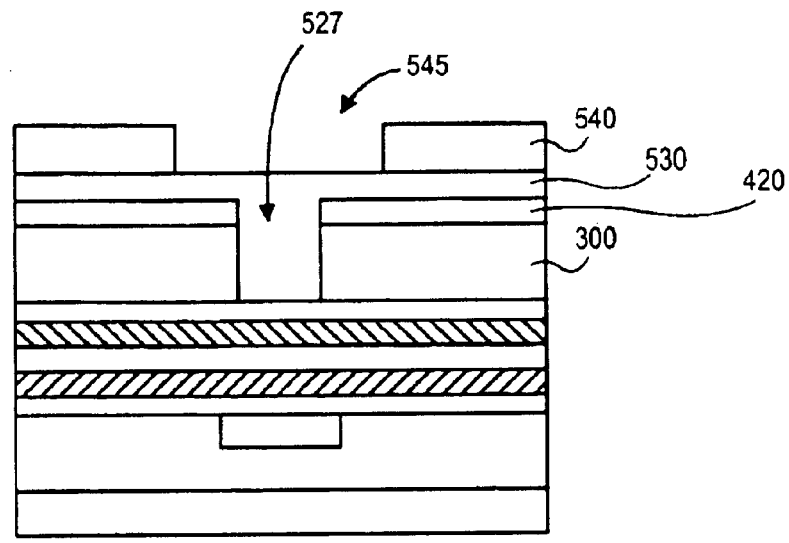

Using the etch stop layer 200 underneath the ILD 300 allows a longer over etch to clean out the bottom of the via opening 527 without damaging the underlying conductor 50 connected to the device in the wafer 90. The etch stop layer 200 should be thick enough to prevent breakthrough during via opening 527 etch, as shown in an embodiment of the present invention in FIG. 2D. The etch selectivity of the ILD 300 relative to the etch stop layer 200 should be about 20:1 or greater.

The upper adhesion promoter layer 256 is very thin and does not interfere with the etch of the ILD 300 to form the via opening 527. The very thin upper adhesion promoter layer 256 also does not interfere with the subsequent over etch to clean out the bottom of the via opening 527.

After formation of the via opening 527 (over the etch stop layer 200), the processes of photolithography and etch are used again to pattern a trench. A bottom anti-reflective coating (BARC) 530 may be formed over the hard mask 420 (located over the ILD 300) and in the via opening 527, as shown in an embodiment of the present invention in FIG. 2D.

The BARC 530 will minimize potential exposure problems in the vicinity of the upper corners, sidewalls, and bottom corners of the via opening 527, relating to a combination of swing curve effects/light scattering effects caused by the thickness/step change in the hard mask 420/ILD 300 as well as the surface curvature/thickness variation in the trench-layer photoresist 540.

Then, a trench-layer photoresist 540, is applied over the BARC 530.

The trench-layer photoresist 540 is exposed using radiation of the appropriate wavelength, energy, and dose. The exposure is performed in an imaging tool, such as a stepper or a scanner, and modulated by a trench-layer reticle. Exposure is followed by development of a trench feature 545 in the trench-layer photoresist 540. The trench feature 545 in the trench-layer photoresist 540 is superimposed over the via opening 527 etched into the ILD 300. The shape and CD of the trench feature 545 is derived from a design on the trench-layer reticle.

A dry etch process, such as a plasma etch process or an RIE process, may be used to etch the BARC 530 and the hard mask 420. The BARC 530 minimizes further etch of the via opening 527, during the etch of the trench, that may alter the width, depth, or sidewall profile of the via opening 527.

Then, the trench-layer photoresist 540 is stripped off, leaving the hard mask 420 in place over the ILD 300 and the remaining portion of the BARC 530 in the via opening 527.

Figure 2E:
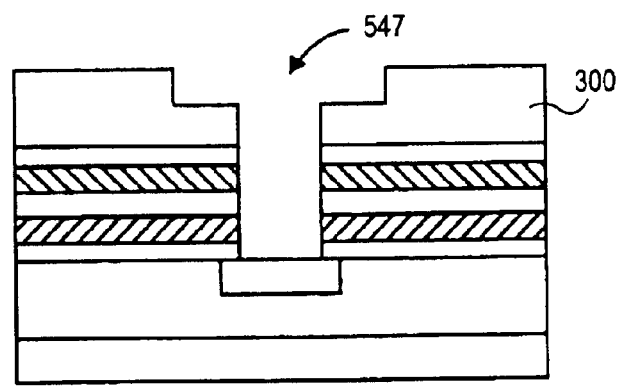

Another dry etch process is used to etch partially into the ILD 300 to form a trench over the via opening 527, as shown in an embodiment of the present invention in FIG. 2E. High directionality is desired for the trench etch when the narrowest portion of the trench-via opening 547 has a large aspect ratio (depth:width), such as about 7:1 or greater. In one embodiment, a high density plasma, such as an RF ICP, may be used for the trench etch.

The dry etch of the ILD 300 to form the trench-via opening 547 may be performed with a gas mixture. The gas mixture for etching an ILD 300 formed from an inorganic material may include an etching gas, such as $CF_4$, and a polymerizing gas, such as $CH_2F_2$. The etching gas serves as the principal source of Fluorine for etching the ILD 300 while the polymerizing gas improves selectivity by passivating the sidewalls of the trench-via opening 547. The etch selectivity of the ILD 300 relative to the hard mask 420 may be about 20:1 or greater. Other gases that may be used for trench etch include $CHF_3$ and $C_3F_6$. The etch rate of the ILD 300 may be selected from a range of about 1,500–12,000 Angstroms per minute.

The BARC 530 minimizes further etch of the via opening 527, during the etch of the trench, that may alter the width, depth, or sidewall profile of the portion of the via opening 527 below the superimposed trench opening.

Then, any remnant of the BARC 530 is removed from the via opening 527.

Next, a portion of the etch stop layer 200 underlying the trench-via opening 547 is removed after completion of the etch of the trench opening, as shown in an embodiment in FIG. 2E. The underlying conductor 50 should not be damaged by the removal of the portion of the etch stop layer 200 below the trench-via opening 547.

In another embodiment of the present invention, the portion of the etch stop layer 200 underlying the trench-via opening 547 may be removed earlier in the process sequence, such as after completion of the etch of the via opening 527.

The upper adhesion promoter layer 256 and the lower adhesion promoter layer 156 are both very thin and will not interfere with the removal of the portion of the etch stop layer 200 underlying the trench-via opening 547.

The hard mask 420 is then removed. In one embodiment of the present invention, the trench etch, the removal of the portion of the etch stop layer 200 underlying the trench-via opening 547, and the hard mask 420 removal may be performed sequentially in an integrated tool.

The trench-via opening 547 will be filled later with a conductor layer 700 to make electrical contact with the device connected to the underlying conductor 50, as shown in an embodiment in FIG. 2F. The conductor layer 700 may be formed from Copper which has a high diffusivity in Silicon. Thus, a barrier layer 630 is first formed over the ILD 300 and in the trench-via opening 547. The barrier layer 630 must encapsulate the sides and the bottom of the trench-via opening 547 to prevent diffusion of Copper into the ILD 300 and other underlying layers in the stack of the interconnect system. Otherwise, Copper may introduce mid-gap states into semiconductor material, such as Silicon, in the wafer 90 and degrade carrier lifetime.

The barrier layer 630 may be formed from a metal, including a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), or Tungsten-Nitride (WN). The barrier layer 630 may have a thickness selected from a range of about 80–600 Angstroms.

In one embodiment, the barrier layer 630 may include a lower layer of TaN to adhere to the underlying ILD 300 and an upper layer of Ta to adhere to the overlying seed layer 650. A barrier layer 630 formed as a bilayer may have a total thickness selected from a range of about 75–350 Angstroms.

High directionality is desired for forming the barrier layer 630, especially when the narrowest portion of the trench-via opening 547 has a large aspect ratio (depth:width), such as 7:1 or greater. The technique of ionized physical vapor deposition (I-PVD) may be used to form the barrier layer 630 with better step coverage than other techniques, such as collimation sputtering or long-throw sputtering (LTS).

In certain cases, a MOCVD process may be used to form the barrier layer 630. Alternatively, the barrier layer 630 may be formed using ALD, especially for a thickness of about 100 Angstroms or less. ALD may provide good step coverage and good thickness uniformity even while permitting the use of a low deposition temperature of about 200–400 degrees Centigrade.

When the trench-via opening 547 is to be filled later by electroplating a conductor layer 700, a seed layer 650 should first be formed over the barrier layer 630, as shown in an embodiment in FIG. 2F. In order to serve as a base for electroplating, the seed layer 650 must be electrically conductive and continuous over the barrier layer 630. Adhesion loss of the seed layer 650 from the underlying barrier layer 630 should be prevented. Interfacial reaction of the seed layer 650 with the underlying barrier layer 630 should also be prevented.

The seed layer 650 may be formed from the same or different material as the conductor layer 700 to be formed later. The seed layer 650 may include a metal, such as Copper, or an alloy. In one embodiment of the present invention, the seed layer 650 may have a thickness selected from a range of about 400–2,000 Angstroms.

The seed layer 650 may be formed by I-PVD, especially when the conductor layer 700 is to be formed later by electroplating. If desired, the barrier layer 630 and the seed layer 600 may be sequentially deposited in a tool, without breaking vacuum, so as to prevent formation of an interfacial layer between the barrier layer 630 and the seed layer 650.

When the conductor layer 700 is to be subsequently formed by PVD, better material properties and surface characteristics may be achieved for the conductor layer 700 if the seed layer 650 is formed using CVD. The seed layer 650 may also be formed with ALD or electroless plating.

The conductor layer 700, such as a metal, may be formed over the seed layer 650 by an electrochemical process, such as electroplating. The conductor layer 700 may have a thickness that provides an overburden of about 1,000–4,000 Angstroms above the ILD 300.

In other embodiments, the conductor layer 700 may be formed with a PVD or CVD process. A PVD or CVD process may be particularly advantageous when forming the conductor layer 700 over a trench-via opening 547 that has a large aspect ratio (depth:width), such as about 7:1 or greater. A PVD process usually has a lower Cost-of-Ownership (CoO) than a CVD process. In certain cases, a MOCVD process may be used.

The conductor layer 700 may be treated after being formed to modify its material properties or surface characteristics. The treatment may include a rapid thermal anneal (RTA) process after deposition to modify or stabilize grain size. For example, Copper that is formed by electroplating may have a grain size of about 0.05–10.0 um, depending on the thickness, deposition conditions, and anneal conditions. A larger grain size usually corresponds to a lower resistivity which may be more desirable. Copper may have a resistivity of about 1.7–2.5 micro-ohm-centimeter (uohm-cm) at 20 degrees Centigrade.

Figure 2F:
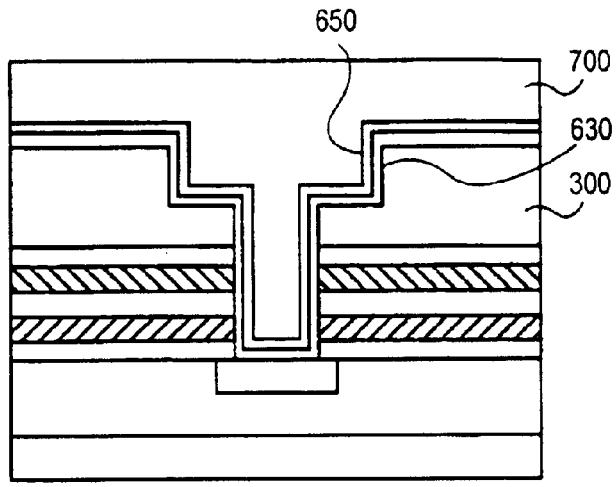
Figure 2G:
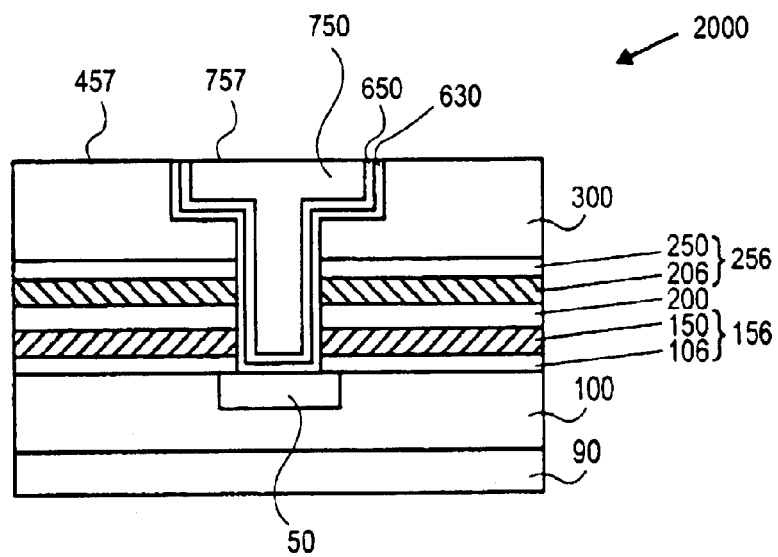

A chemical-mechanical polishing (CMP) process may be used to remove the overburden of the conductor layer 700 and the portions of the seed layer 650 and the barrier layer 630 over an upper surface 457 of the ILD 300 to create an inlaid interconnect 750 in the trench-via opening 547, as shown in an embodiment in FIGS. 2F–2G.

The process of CMP combines abrasion and dissolution to planarize topography or relief at a surface. Abrasion occurs when a polish pad and abrasive particles, suspended in a polish slurry, apply mechanical forces to flatten and smoothen higher portions of the surface. Dissolution occurs when chemicals in the slurry react with certain materials at the surface to form soluble byproducts.

The CMP process to create an inlaid interconnect 750 in the trench-via opening 547 includes optimization of the polish selectivity for different materials at the surface. Polish selectivity may be optimized by changing the polish rates of the different materials. The polish rates may depend on selection of the pad, the slurry, and the polishing conditions. A harder pad may planarize more effectively, but a softer pad may generate fewer defects. The slurry composition may include abrasive particles, an oxidizer, a corrosion inhibitor, and various other additives. The abrasive particles may include Alumina ($Al_2O_3$) or Silica ($SiO_2$). The pH of the slurry may be adjusted to produce a desired polish rate and polish selectivity. The tool parameters may include a polish pressure of about 1–5 pounds per square inch (psi) and platen speed and carrier speed of about 20–125 revolutions per minute (rpm).

In a first embodiment of the present invention, the CMP process involves three polishes. Each polish includes optimization of the polish rates and the polish selectivity by using a different combination of slurry, pad, and polish tool parameters. The first polish removes most of the overburden of the conductor layer 700. The second polish planarizes the remaining conductor layer 700 and the portion of the seed layer 650 that is located over the barrier layer 630. The polish rate of the conductor layer 700 in the first polish and the second polish may be selected from a range of about 900–13,000 Angstroms per minute. The third polish removes the portion of the barrier layer 630 that is located over the upper surface 547 of the ILD 300.

The polish rate of the barrier layer 630 may be selected from a range of about 100–1,000 Angstroms per minute. In an embodiment of the present invention, the polish of the barrier layer 630 may be highly selective relative to the ILD 300. A selective process preserves most of the thickness of the conductor layer 700 and the ILD 300, but may result in excessive dishing and erosion. Dishing is the recessing of the conductor layer 700 in large open features. Erosion is the recessing of both the conductor layer 700 and the ILD 300 towards the center of clusters of small-pitch, high-density lines which tend to clear quickly.

In another embodiment of the present invention, the polish of the barrier layer 630 may be relatively non-selective relative to the conductor layer 700 and the ILD 300. A non-selective process provides good planarity, but may result in excessive thinning of the conductor layer 700 and the ILD 300.

In a second embodiment of the present invention, the CMP process involves two polishes. The first polish removes all of the overburden of the conductor layer 700 and planarizes the conductor layer 700 and the portion of the seed layer 650 that is located over the barrier layer 630. The second polish removes the portion of the barrier layer 630 over the upper surface 547 of the ILD 300.

In a third embodiment of the present invention, the CMP process involves one polish to remove all of the overburden of the conductor layer 700, as well as the portions of the seed layer 630 and the barrier layer 650 that are located over the ILD 300.

The material and mechanical properties of the ILD 300 must be sufficient to prevent any deformation, fracture, or delamination of the ILD 300 during the CMP process that is used to planarize the conductor layer 700. Otherwise, electrical shorts and other polish-induced defects may occur, thus degrading yield.

The mechanical strength of the ILD 300 depends on the mechanical strength of the bulk material forming the ILD 300. If the ILD 300 is porous, the mechanical strength of the ILD 300 also depends on the porosity and the pore size, shape, and distribution. Young's modulus of elasticity is a measurement of mechanical strength of a material. In a first embodiment, the ILD 300 is porous with a Young's modulus of elasticity of about 3 GigaPascals (GPa) or higher. Shear strength is another measurement of mechanical strength of a material. In a second embodiment, the ILD 300 is porous with a shear strength of about 1 GPa or higher. Fracture toughness is still another measurement of mechanical strength of a material.

After the CMP process, the upper surface 757 of the inlaid interconnect 750 should be approximately flat and level with the upper surface 547 of the ILD 300.

After planarization with CMP, another etch stop layer may be formed over an upper surface 757 of the inlaid interconnect 750 and the upper surface 457 of the ILD 300. In some cases, the etch stop layer may also serve as a capping layer to prevent diffusion, intermixing, or reaction of the inlaid interconnect 757 with the surrounding materials.

A process sequence similar to the embodiment of the present invention shown in FIGS. 2A–2G may be repeated to form the next higher layer in the stack of the interconnect system. In a dual Damascene scheme, each layer includes a via and an overlying trench. The total number of layers may depend on the device design rule. In one embodiment, a total of 7–10 layers may be formed.

A structure 2000 that includes a very thin adhesion promoter layer, such as a metal oxide, at an interface between an ILD and an etch stop layer or a hard mask will be described next. As shown in an embodiment of the present invention in FIG. 2G, the structure 2000 includes a lower conductor 50 that is embedded or inlaid in a lower ILD 100 located over a wafer 90, as well as an upper inlaid interconnect 750 that is embedded or inlaid in an upper ILD 300. The lower conductor 50 and the upper inlaid interconnect 750 may each include a metal, such as Copper, or an alloy.

The lower ILD 100 and the upper ILD 300 may each have a thickness selected from a range of about 0.1–2.0 um. Although they need not be formed from the same material, both the lower ILD 100 and the upper ILD 300 should have a low dielectric constant, such as a k value of 2.5 or lower, as well as good mechanical strength, such as a Young's modulus of elasticity of about 3 GPa or higher and a shear strength of about 1 GPa or higher.

The lower ILD 100 and the upper ILD 300 may each be formed from a dielectric material, such as a SOD or a CDO. In an embodiment of the present invention, the lower ILD 100 and the upper ILD 300 may each have pores, with a void fraction by volume, or porosity, of about 0.02–0.75. The pores may have a diameter selected from a range of about 50–200 Angstroms.

The upper surface 757 of the upper inlaid interconnect 750 should be approximately flat and level with the upper surface 547 of the upper ILD 300. In an embodiment of the present invention, the upper inlaid interconnect 750 that is located within the upper ILD 300 is further encapsulated by a diffusion barrier layer 630. The diffusion barrier layer 630 may have a thickness selected from a range of about 80–600 Angstroms. In another embodiment of the present invention, a seed layer 650 is also located between the diffusion barrier layer 630 and the upper inlaid interconnect 750. The seed layer 650 may have a thickness selected from a range of about 400–2,000 Angstroms.

In a first embodiment of the present invention, a lower adhesion promoter layer 156 is located between the lower ILD 100 and an etch stop layer 200. In one embodiment of the present invention, the lower adhesion promoter layer 156 may have a thickness of about 1–3 atoms. In another embodiment of the present invention, the lower adhesion promoter layer 156 may have a thickness of about 3–9 Angstroms. In still another embodiment of the present invention, the lower adhesion promoter layer 156 may have a thickness of about 4–20 Angstroms.

The lower adhesion promoter layer 156 may include a lower activated layer 106 and a lower buffer layer 150. In an embodiment of the present invention, about 20–100% of the lower activated layer 106 is covered by the lower buffer layer 150. In another embodiment of the present invention, the lower activated layer 106 is covered by about one monolayer (saturated) of the lower buffer layer 150. In still another embodiment of the present invention, the coverage of the metal oxide in the lower buffer layer 150 over the lower activated layer 106 is about $1–5 \times 10^{14}$ atoms/cm$^2$.

In a second embodiment of the present invention, an upper adhesion promoter layer 256 is located between the etch stop layer 200 and the upper ILD 300. In one embodiment of the present invention, the upper adhesion promoter layer 256 may have a thickness of about 1–3 atoms. In another embodiment of the present invention, the upper adhesion promoter layer 256 may have a thickness of about 3–9 Angstroms. In still another embodiment of the present invention, the upper adhesion promoter layer 256 may have a thickness of about 4–20 Angstroms.

The upper adhesion promoter layer 256 may include an upper activated layer 206 and an upper buffer layer 250. In an embodiment of the present invention, about 20–100% of the upper activated layer 206 is covered by the upper buffer layer 250. In another embodiment of the present invention, the upper activated layer 206 is covered by about one monolayer (saturated) of the upper buffer layer 250. In still another embodiment of the present invention, the coverage of the metal oxide in the upper buffer layer 250 over the upper activated layer 206 is about $1–5 \times 10^{14}$ atoms/cm$^2$.

In a third embodiment of the present invention, both the lower adhesion promoter layer 156, as described earlier, and the upper adhesion promoter layer 256, as described earlier, are included in the structure 2000, as shown in FIG. 2G.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of improving adhesion at an interface between dielectric materials, as well as, a structure including an adhesion promoter layer at the interface between dielectric materials.

We claim:

1. A structure comprising:

a substrate;

a first interlayer dielectric disposed over said substrate;

a first adhesion promoter layer disposed over said first interlayer dielectric;

an etch stop layer disposed over said first adhesion promoter layer;

a second adhesion promoter layer disposed over said etch stop layer; and a second interlayer dielectric disposed over said second adhesion promoter layer wherein said first and second interlayer dielectric layers each comprises Carbon-doped Oxide (CDO).

2. The structure of claim 1 wherein said first and second adhesion promoter layers each comprises an activated layer and a buffer layer.

3. The structure of claim 1 wherein said first and second adhesion promoter layers each comprises a thickness of about 4–20 Angstroms.

* * * * *

UNITED STATES PATENT AND TRADEMARK OFFICE
CERTIFICATE OF CORRECTION

PATENT NO.     : 6,713,873 B1
DATED          : March 30, 2004
INVENTOR(S)    : O'Loughlin et al.

It is certified that error appears in the above-identified patent and that said Letters Patent is hereby corrected as shown below:

Column 3,
Line 10, delete "-3", insert -- 1-3 --.
Line 12, delete "-9", insert -- 3-9 --.
Line 14, delete "1-20", insert -- 4-20 --.

Column 6,
Line 58, delete "$10^{31\ 5}$-$10^{1}$", insert -- $10^{-5}$-$10^{1}$ --.

Signed and Sealed this

Twenty-fifth Day of May, 2004

JON W. DUDAS
*Acting Director of the United States Patent and Trademark Office*